(12) United States Patent
Parekh (10) Patent No.: US 8,799,750 B1
(45) Date of Patent: Aug. 5, 2014

(54) CONVOLUTIONAL INTERLEAVER FOR BURSTY MEMORY ACCESS

(75) Inventor: Hemang M. Parekh, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 240 days.

(21) Appl. No.: 13/103,979

(22) Filed: May 9, 2011

(51) Int. Cl.
*H03M 13/23* (2006.01)
*G06F 13/28* (2006.01)

(52) U.S. Cl.
CPC .............. *H03M 13/235* (2013.01); *G06F 13/28* (2013.01)
USPC ............ 714/786; 714/701; 711/217; 711/218

(58) Field of Classification Search
CPC ..... G06F 12/0607; G06F 13/28; H03M 13/23
USPC .................................. 711/157; 714/701, 786
See application file for complete search history.

(56) References Cited

U.S. PATENT DOCUMENTS

| | | | | |
|---|---|---|---|---|
| 5,537,420 | A * | 7/1996 | Huang | 714/701 |
| 5,572,532 | A * | 11/1996 | Fimoff et al. | 714/702 |
| 5,745,497 | A * | 4/1998 | Ben-Efraim et al. | 714/702 |
| 5,912,898 | A * | 6/1999 | Khoury | 714/701 |
| 6,078,636 | A * | 6/2000 | Shirai et al. | 377/26 |
| 6,411,654 | B1 * | 6/2002 | Furutani et al. | 375/262 |
| 6,421,796 | B1 * | 7/2002 | Gatherer | 714/702 |
| 6,430,201 | B1 * | 8/2002 | Azizoglu et al. | 370/535 |
| 6,760,743 | B1 * | 7/2004 | Heddes et al. | 718/100 |
| 6,971,057 | B1 * | 11/2005 | Delvaux et al. | 714/788 |
| 7,024,597 | B2 * | 4/2006 | Cameron | 714/702 |
| 7,051,171 | B1 * | 5/2006 | Liu et al. | 711/157 |
| 7,254,649 | B2 * | 8/2007 | Subramanian et al. | 710/8 |
| 7,555,576 | B2 * | 6/2009 | Leijten | 710/35 |
| 7,644,340 | B1 * | 1/2010 | Liu | 714/762 |
| 7,716,563 | B2 * | 5/2010 | Deczky | 714/787 |
| 2002/0120902 | A1 * | 8/2002 | Brown | 714/776 |
| 2005/0063421 | A1 * | 3/2005 | Wan et al. | 370/509 |
| 2005/0251726 | A1 * | 11/2005 | Takamura | 714/755 |
| 2006/0271751 | A1 * | 11/2006 | Chen et al. | 711/157 |
| 2007/0083625 | A1 * | 4/2007 | Chamdani et al. | 709/223 |
| 2008/0028188 | A1 * | 1/2008 | Zhong | 712/200 |
| 2011/0113305 | A1 * | 5/2011 | Liu et al. | 714/773 |

OTHER PUBLICATIONS

Khater et al. "Efficient FPGA Implementation for the IEEE 802.16e Interleaver" published Dec. 22, 2009.*
Xilinx Virtex-6 User Guide UG366 (v2.6) published Jul. 27, 2011.*
International Telecommunication Union Recommendation J.83 "Digital multi-programme systems for television, sound and data services for cable distribution" published Dec. 2007. Excerpt of title sheet and pp. 14-15.*
Yanting et al. "Improved Method to Realize the Multiplex Time-domain Interleaver" published Nov. 29, 2009.*

(Continued)

*Primary Examiner* — Charles Rones
*Assistant Examiner* — Andrew Russell
(74) *Attorney, Agent, or Firm* — Scott Hewett; John J. King (57) ABSTRACT

A convolutional interleaver uses local memory of a first IC in combination with burst-type memory of a second IC. When a burst of data is read from memory of the second IC, one data value is provided to a data output and the remaining values are temporarily stored in local memory. After the memory of the second IC is initially filled, burst WRITE and burst READ operations provide efficient data transmission between the ICs.

20 Claims, 4 Drawing Sheets

(56) References Cited

OTHER PUBLICATIONS

Altera FPGA and Altera External Memory Interfaces published Mar. 29, 2009 and Mar. 20, 2011 respectively.*

Upadhyaya et al. "Novel Design of Address Generator for WiMAX Multimode Interleaver using FPGA based Finite State Machine" published Dec. 25, 2010.*

Nayak et al. "FPGA Implementation of Convolutional Interleaver & Deinterleaver" published Sep. 2011.*

Xilinx, Inc., "Designing Convolutional Interleavers with Virtex Devices", Application Note: Virtex Series, XAPP222 (v1.0) Sep. 27, 2000, pp. 1-6.

* cited by examiner

CONVOLUTIONAL INTERLEAVER FOR BURSTY MEMORY ACCESS

FIELD OF THE INVENTION

An embodiment of the invention relates generally to integrated circuits, and more particularly to techniques for converting serial data to words of data using interleaver circuits.

BACKGROUND OF THE INVENTION

Interleavers (block or convolutional) are popular techniques for protecting data from noise in data transmission systems, such as SDH and PDH radio systems, GSM and UMTS mobile communication systems, and point-to-multipoint radio systems. Interleaver techniques are also used in conjunction with data scramblers (synchronous and asynchronous), check codes, error correction codes (e.g., Reed-Solomon, Viterbi, BCH), and are used to control impulse noise. Convolutional interleavers are often used in conjunction with Viterbi or Reed-Solomon codecs, since the load is dramatically reduced after the de-interleaver stage. Convolutional interleavers are conceptually similar to block interleavers, although they are more complex to implement. Convolutional interleavers are area efficient, using only half the density needed by block interleavers.

On the transmit side of a data transmission system, a convolutional interleaver is often used to parallelize serial input data into N-bit words and shift the data word through N delay lines. The delayed data is then shifted out through a parallel-in-serial-out (PISO) shift register for transmission. At the receiver, the incoming data stream is reconstructed with dual delay lines and shift registers.

The heart of a convolutional interleaver is a set of progressive delay lines. Delay lines in conventional interleavers use flip-flops, which are register-intensive, and consume relatively scarce silicon resources. Convolutional interleavers have been developed for use with field-programmable gate array (FPGA) devices that use multi-port memory, such as dual-port static random access memory (SRAM) and progressive delay lines that save logic resources and produce highest performance. Block SRAM (BRAM) resources are typically used in many applications running on an FPGA, and multi-port BRAM is a highly utilized resource. Implementations of convolutional interleavers have been built using external memory resources, such as external SRAM chips, which mimic on-chip BRAM of FPGAs, and are relatively easily incorporated into existing convolutional interleaver algorithms. External memory techniques are especially desirable for use in larger interleavers, where using on-chip memory resources might compromise other applications. However, the cost of SRAM chips is relatively high compared to other types of memory and conventional convolutional interleavers do not efficiently use memories that can operate in burst modes.

Convolutional interleaver techniques that overcome the limitations of conventional convolutional interleavers are desirable.

SUMMARY OF THE INVENTION

In one embodiment, a system includes a first integrated circuit having a local memory, an address generator receiving interleaver settings and generating WRITE addresses according to first interleaver settings and READ addresses according to second interleaver settings, a physical controller, and a WRITE controller, and a second integrated circuit having memory supporting burst WRITE operations and burst READ operations, the physical controller of the first integrated circuit writing data from the first integrated circuit to memory locations of the second integrated circuit as a WRITE burst of data, and reading data from the second integrated circuit to the first integrated circuit as a READ burst of data, at least one datum from the READ burst of data being stored in the local memory at an address provided by the WRITE controller according to the interleaver settings.

In a particular embodiment, the system is a portion of an interleaver system, and in a more particular embodiment is a convolutional interleaver system. In a further embodiment, the convolutional interleaver system comprises multiple channels.

In a particular embodiment, the memory of the second integrated circuit comprises multi-port memory. In another embodiment, the memory of the second integrated circuit comprises double data rate random access memory. In a particular embodiment, the local memory comprises cache memory.

In a particular embodiment, the READ burst of data has N data values where N is an integer. One data value is output upon being read, and the remaining N–1 data values are written to the local memory.

In a particular embodiment, the first integrated circuit is a field-programmable gate array and the local memory is configured in the field-programmable gate array according an interleaver type. In a further embodiment, the second IC is a second field-programmable gate array.

In a particular embodiment, the memory of the second integrated circuit has a number of data storage locations used in the system not less than $R*(R-1)*M$ wherein R is a number of rows in a convolutional interleaver memory system and M is a delay length of second row in the convolutional interleaver system.

In another embodiment, a data interleaver system operates by accumulating N data values from a data input of a first integrated circuit to form a WRITE data burst. WRITE addresses for the N data values in the WRITE data burst are defined for writing to an external memory of a second integrated circuit and the WRITE data burst is written to the external memory. READ addresses from the external memory are calculated for a READ data burst and the READ data burst is read from the external memory. A first data value from the READ data burst is sent to a data output port of the first integrated circuit and the remaining values of the READ data burst are stored in local memory of the first integrated circuit. The remaining values of the READ data burst are read from the local memory in a sequence according to the data interleaver system and providing the remaining values to the data output port.

In a further embodiment, after reading the remaining values, data values from the data input are accumulated to form a second WRITE data burst; and the second WRITE data burst is written to the external memory. The second burst WRITE occurs before, or alternatively after, the burst READ operation. In some embodiments, the WRITE data burst and the second WRITE data burst contain partially redundant data.

In a particular embodiment, the external memory has a first sector and a second sector. The WRITE data burst and the second WRITE data burst are written to the first sector, and the READ data burst is read from the second sector. After a selected number of WRITE bursts have been written to the first sector of the external memory, writing from the first sector is switched to the second sector and concurrently reading from the second sector is switched to the first sector. In a particular embodiment, the selected number of WRITE bursts equals a burst size of the WRITE burst. In a particular embodiment, the first sector has a number of rows and the second sector has the number of rows. In a particular embodiment, a burst size of the WRITE data burst is equal to half the number of rows.

In a particular embodiment, the N data values for a WRITE burst are accumulated from a data channel of a field-programmable gate array, and in a further embodiment, data values are further accumulated from a second data channel of the field-programmable gate array.

In another embodiment, a convolutional interleaver memory system includes a first integrated circuit (IC) having a WRITE buffer receiving data from a data channel of the first IC and a second integrated circuit having memory operable to be written to and read from in a burst fashion. An address generator of the first IC assigns memory locations in the memory for data in WRITE bursts according to settings of the convolutional interleaver memory system and a local memory of the first IC storing at least N−1 data values of a READ burst from the memory.

DETAILED DESCRIPTION OF THE DRAWINGS

Prior generation convolutional interleavers used a shifting process to shift values along rows of the interleaver register. For example, a value in the first column of each row would be shifted to the second column, if present. Rows of the shift register are typically arranged in order of a bypass row, M, 2M, 3M, . . . (R−1)M where R is the number of rows (arms) in the register and M is an integer. For example, if M=3, after the bypass arm, the next arm has three data locations, the next row has six data locations, and the next row has nine data locations, etc. The arms are accessed in a circulating fashion (i.e., row 1-2-3-4-1-2-3-4- . . . ) at a rotation rate $f_s$. During a rotation, values are written into the first columns of the rows and read from the last column of each row, which is the third, sixth, or ninth column in the simplified example above. Henceforth, convolutional interleavers will be referred to as interleavers for simplicity of discussion.

In a shift-type interleaver, each register value shifts to the right when a new value is written into the arm, and each arm is accessed at a rate of $f_s/R$, which is known as the effective shifting rate. The shift-register process can be substituted with a memory access technique. If the READ/WRITE access is operating at a fixed rate (e.g., $f_s/R$), the interleaver accesses the appropriate address to READ the end-of-row value and accesses the addresses of the other row data to perform READ/WRITE operations emulating a register shift operation.

The operation of a (4, 3) interleaver with register locations indicated by letters is understood in reference to Table 1 and Table 2, below:

TABLE 1

Register locations for a (4, 3) interleaver

| A | | | | | | | | |
| B | E | H | | | | | | |
| C | F | I | K | M | | O | | |
| D | G | J | L | N | | P | Q | R | S |

In a conventional memory-based interleaver, the WRITE and READ sequences may be as follows:

TABLE 2

WRITE/READ addresses to memory-based interleaver buffer.

| WRITE Addresses (grouped 4 = R) | READ Addresses (grouped 4 = R) |
| --- | --- |
| ABCD | AXXX |
| AEFG | AXXX |
| AHIJ | AXXX |
| ABKL | ABXX |
| AEMN | AEXX |
| AHOP | AHXX |
| ABCO | ABCX |
| AEFR | AEFX |
| AHIS | AHIX |
| ABKD | ABKD |
| AEMG | AEMG |
| AHOJ | AHOJ |
| ABCL | ABCL |
| AEFN | AEFN |
| AHIP | AHIP |
| ABKQ | ABKQ |
| AEMR | AEMR |
| AHOS | AHOS |
| repeat | ABCD |
| | AEFG |
| | AHIJ |
| | ABKL |
| | AEMN |
| | AHOP |
| | ABCO |
| | AEFR |
| | AHIS |
| | ABKD |
| | AEMG |
| | AHOJ |
| | ABCL |
| | AEFN |
| | AHIP |
| | ABKQ |
| | AEMR |
| | AHOS |
| | repeat |

The READ addresses labeled as X are arbitrary. Any address could be read during those cycles and the READ data is typically discarded at the output of the corresponding de-interleaver. Since the first nine address sets in the READ sequence listed in Table 2 have X's, note that those memory locations could be the same as the first nine address sets in the WRITE sequence. Thus, the READ and WRITE addresses can be identical and certain memory structures with READ-before-WRITE operation can use single-port addressing to achieve double efficiency (in terms of number of clock cycles) by reading and writing on the same clock cycle. In the above example, A is assumed to be a real memory location; however, for interleaver operational purposes, there is no buffer for that area. An output multiplexer can bypass this value, as well as the values from the X-registers, based on the latency of the WRITE/READ side when using the memory.

Past implementations have used SRAM-based memories, which are easily adapted to the address scheme described above. Current memory technologies, such as double data rate (DDR) SRAM, dynamic random access memory (DRAM), quad data rate (QDR) SRAM, and reduced latency DRAM (RLDRAM) offer options for burst mode READ and WRITE operations. In burst mode, once a memory address is put on the address bus, a burst of memory locations are accesses during the next few operating cycles. Conventional memory-based interleaver implementations do not have a contiguous memory access pattern, so, for example, in a burst of four operating cycles, only one in every four cycles and location are utilized by the interleaver. This reduced efficiency makes available technologies ineffective.

For smaller interleaver configurations where the memory space needed is small, it doesn't make sense to use external memory techniques, but to just use on-chip SRAM memories. The example above of a (4, 3) interleaver would probably be implemented using on-chip memory; however, it is provided for purposes of illustration regarding the operation of an off-chip memory implementation. Reading the addressing pattern, one can see that the pattern repeats after quite a few cycles and the bigger the interleaver, the longer the time before the pattern repeats. The pattern cycle is R*lcm(1, M, 2M, ..., (R−1)M), where lcm=Least Common Multiple.

The same arm is accessed once every Rcycles. Hence the write burst could theoretically be R cycles long, followed by R individual read operations. But to make the write operations burst friendly, various memory locations have to be duplicated so that they are available as part of each burst. The smallest size of memory needed to make write burst friendly will be R*(R−1)*M.

A burst-type register map with duplicate memory locations is shown below in Table 3:

TABLE 3

Duplicate memory location for burst-type interleaver

| A | a | b | c | d | e | f | g | h |
| B | E | H | i | j | k | l | m | n |
| C | F | I | K | M | O | o | p | q |
| D | G | J | L | N | P | Q | R | S |

So for operational purposes, A, a, b, c, d, e, f, g, h are identical, and any of those locations can be written to, but during a READ process, the system needs to remember which one has the needed value for that time sequence. Similarly B, i and I are identical, E, j, m are identical and H, k, n are identical. C, o and sometimes K are identical and so on.

The appropriate WRITE/READ pattern is shown in Table 4:

TABLE 4

Memory address access pattern for bursty WRITEs (READ before WRITE) using twice the memory size (R * (R − 1) * M size total)

| WRITE Addresses (grouped 4 = R) | READ Addresses (grouped 4 = R) |
|---|---|
| ABCD | AXXX |
| aEFG | aXXX |
| bHIJ | bXXX |
| ciKL | cBXX |
| djMN | dEXX |
| ekOP | eHXX |
| floQ | fiCX |
| gmpR | gjFX |

TABLE 4-continued

Memory address access pattern for bursty WRITEs (READ before WRITE) using twice the memory size (R * (R − 1) * M size total)

| WRITE Addresses (grouped 4 = R) | READ Addresses (grouped 4 = R) |
|---|---|
| hngS | hkIX |
| repeat | AIKD |
|  | amMG |
|  | bnOJ |
|  | cBoL |
|  | dEpN |
|  | eHqP |
|  | fiCQ |
|  | gjFR |
|  | hkIS |
|  | repeat |

When the burst size is less than R, R/burst_size should be an integer to make efficient use of READ patterns. All the A, a, b, c, d, e, f, g, h are overwritten by bypass logic, so that pattern (portion of the sequence) can be changed to suit other functions, such as refresh cycles, skipping reads, and row activation.

Thus the read pattern cycle repeats itself in R*(R−1)*M and has a simple addressing scheme. With this method, a memory burst size of 4 in a 128, 8 interleaver (e.g., according to the J.83 Annex 8 standard) with WRITE burst size=memory burst size, and READ occurring after R/write_burst_size WRITE events, the efficiency, which in an older, non-burst interleaver was 12.5% (ignoring refresh and row activation cycle loss), improves to 20% to 60% efficiency of data transmission. If double data rate (DDR) memory is used, half-width data transfers could be done on a half wide memory (e.g., if x4 DDR (burst length (bl)=8) memory is used instead of x8 SDR (bl=4)) and same efficiency numbers can be achieved with bl=8 using a DDR memory as well. In other words, the data can be split as four bits on the rising signal and four bits on the falling signal, so the same efficiency (8-bits per cycle) can be achieved with half the I/O resources. DDR memory is commonly provided as random access memory (RAM).

The read address pattern shows that the READ address for each arm is circularly shifted left by row_index*M locations compared to WRITE address to that row (row_index=0, 1, 2, ..., (R−1)). As seen in reference to Table 4, when bursty reads are done, much of the data read during the first portion of the cycle is unusable, but as the READ pattern continues along an arm for M READS, the data becomes usable. Caching is an option for improving READ efficiency.

If reading can start after appropriate latency, and a minimum of R*read_burst_size*M values are locally stored (e.g. cached) during bursty READs, the next READ value needed by interleaver then will always be preemptively stored in the local memory and access to external memory could continue to be burst read. There is slight cost (in processing time) associated with initially filling the local memory, but after that period, memory can be utilized at 100% (excluding caching cost, row activation for DRAMs, refresh cost for DRAMs and bus turnaround cost).

The read_burst_size and write_burst_size could be adjusted to manage efficiency needed versus available on-chip (local) memory on an FPGA. When interleavers of multiple channels are sharing the external memory, this configurability allows a very good tradeoff between off-chip and on-chip memory resources.

Any change in interleaving type as needed by J.83 Annex B standard (for DOCSIS/M-CMTS/EDGEQAM/etc.), the local memory refilling cost will be re-incurred. In other words, specifics of caching (e.g., size, run time change, R, M) depends on the local memory or cache definition. Thus, if R and M change at run time, local memory resources can be re-configured.

Figure 1:
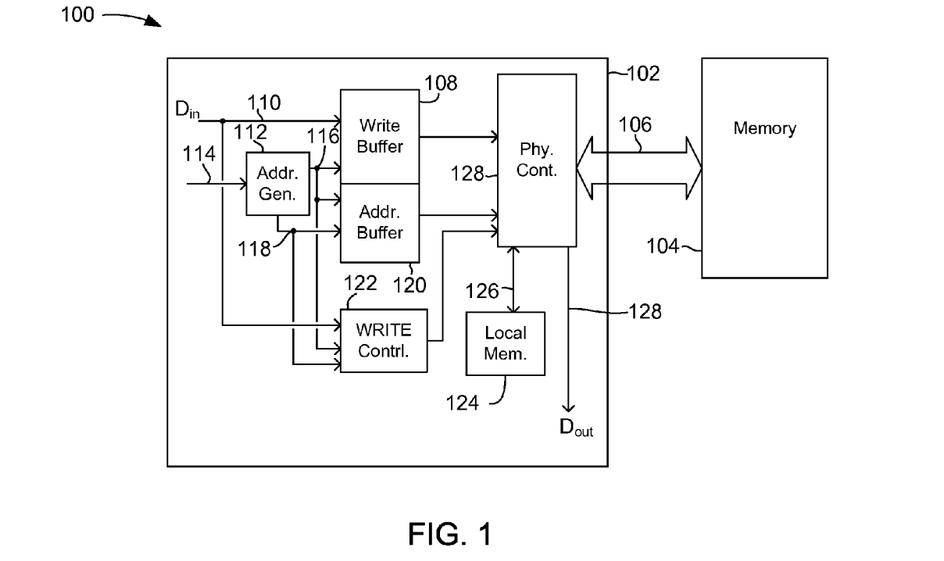
FIG. 1 is a convolutional interleaver memory system according to an embodiment.

FIG. 1 is a convolutional interleaver memory system 100 according to an embodiment. The system 100 is a two-chip system that includes a first IC 102, which in a particular embodiment is a programmable logic device, such as an FPGA, or alternatively is ASSP, or ASIC, and a second IC 104, which in a particular embodiment is a memory chip that supports burst-type memory operation, such as DDR memory chip, or an IC having memory resources (e.g., in addition to logic or other resources), and in a particular embodiment is a second FPGA.

The first and second IC chips 102, 104 are generally mounted in close proximity to each other, such as one chip being mounted on the other (piggyback), or each on a packaging substrate, a printed wiring board (PWB) or similar substrate (not shown). Alternatively, the first and second IC chips are mounted relatively far apart from each other, and may be mounted on separate PWBs or substrates. A data link 106 transfers data between the first IC 102 and the second IC 104. The first IC has a WRITE buffer 108 that receives input data 110 and an address generator 112 that receives interleaver settings 114. The address generator 112 provides WRITE address(es) 116 and READ address(es) 118 to an address buffer 120. The address generator 112 basically decides where to WRITE and READ data in the interleaver based on the interleaver settings 114.

The input data 110, WRITE address 116, and READ address 118 are also coupled to a WRITE control circuit 122. The READ address 118 operates as an override control signal that takes into account READ latencies (e.g., "junk" data read from the memory while the interleaver is filled). The input data 110 signal to the WRITE control circuit 122 acts as a pass-through flag, with the actual data 126 coming from the WRITE buffer 108 or the second IC chip 104 through the data link 106.

The WRITE control circuit 122 uses READ addresses 118 and WRITE address 116 along with latency in various sections of the interleaver design to determine whether to bypass writing a data value read from memory 104 to local memory 124, or to directly send that data value to Dout 128. The local memory 124 stores the remaining data values (i.e., the N−1 data values remaining from a N-burst READ from memory 104 after one of the values has been sent directly to Dout), and the physical controller 128 outputs the locally stored data values to Dout. Dout is generally coupled to the next (downstream) stage of encoding/decoding data path and the read data is reconstructed into a data stream.

Figure 2:
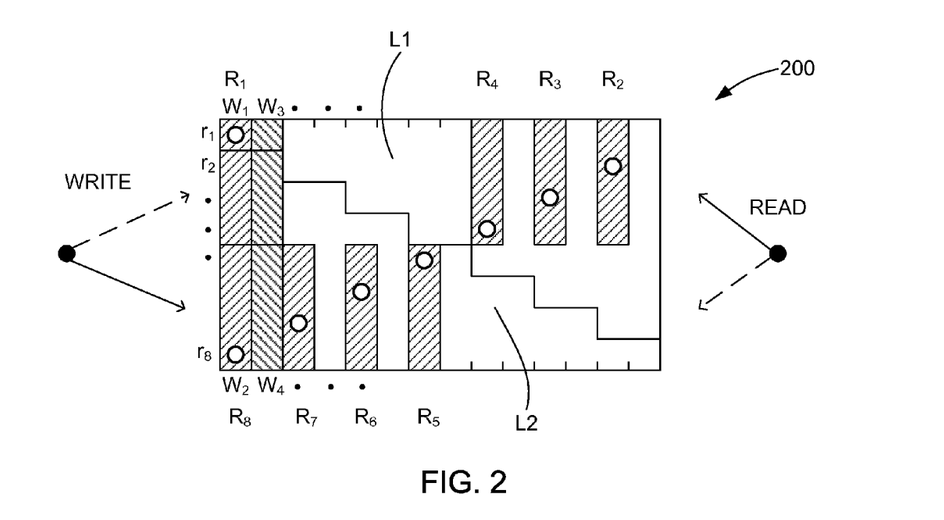
FIG. 2 is a diagram illustrating external memory operation in a data interleaver system according to an embodiment.

FIG. 2 is a diagram illustrating external memory 200 operation in a data interleaver system according to an embodiment. The memory 200 is drawn in a rectangular form for purposes of illustrative discussion, whereas the physical memory may be arranged in a linear fashion. In a particular embodiment, (I, J)=(8, 2) with memory burst (m)=4 in an interleaver configuration. A WRITE state machine writes in a burst to the shaded columnar area titled W1, W2, W3, W4 and so on and in that sequence. The READ state machine shall read in a burst from shaded areas titled R1, R2, R3 and so on. The L1 area (above the "staircase" shape) includes memory locations that are duplicate locations of locations in L2 to allow bursty write operations. The READ state machine reads those R1 through R8 locations in eight burst read operations and shall do the next eight read operations from the adjacent location to the right side of the current R1-R8 shaded locations. As can be seen the read before write operation allows previously written location to read first, before getting overwritten by the new write operation to that same location.

During bursty read, the location indicated by a circle is the content needed immediately and the other three locations are not needed just yet. These additional data that have been read are stored in local memory. In a particular embodiment, it can be seen that after R1-R8 are followed by another eight reads in the adjacent locations, the $3^{rd}$ set of reads will overlap the locations of R1-R8, thus indicating that at this time in the READ state machine, local (e.g., cache) memory can be read to get the desired read sample.

Initially the memory is read more often to keep up with the WRITE rate and to fill up the local memory with cached data; however, after an initial fill-up period (which is 16 READ operations in this particular (8, 2) embodiment), future READs and WRITEs operate at same rate.

Figure 3:
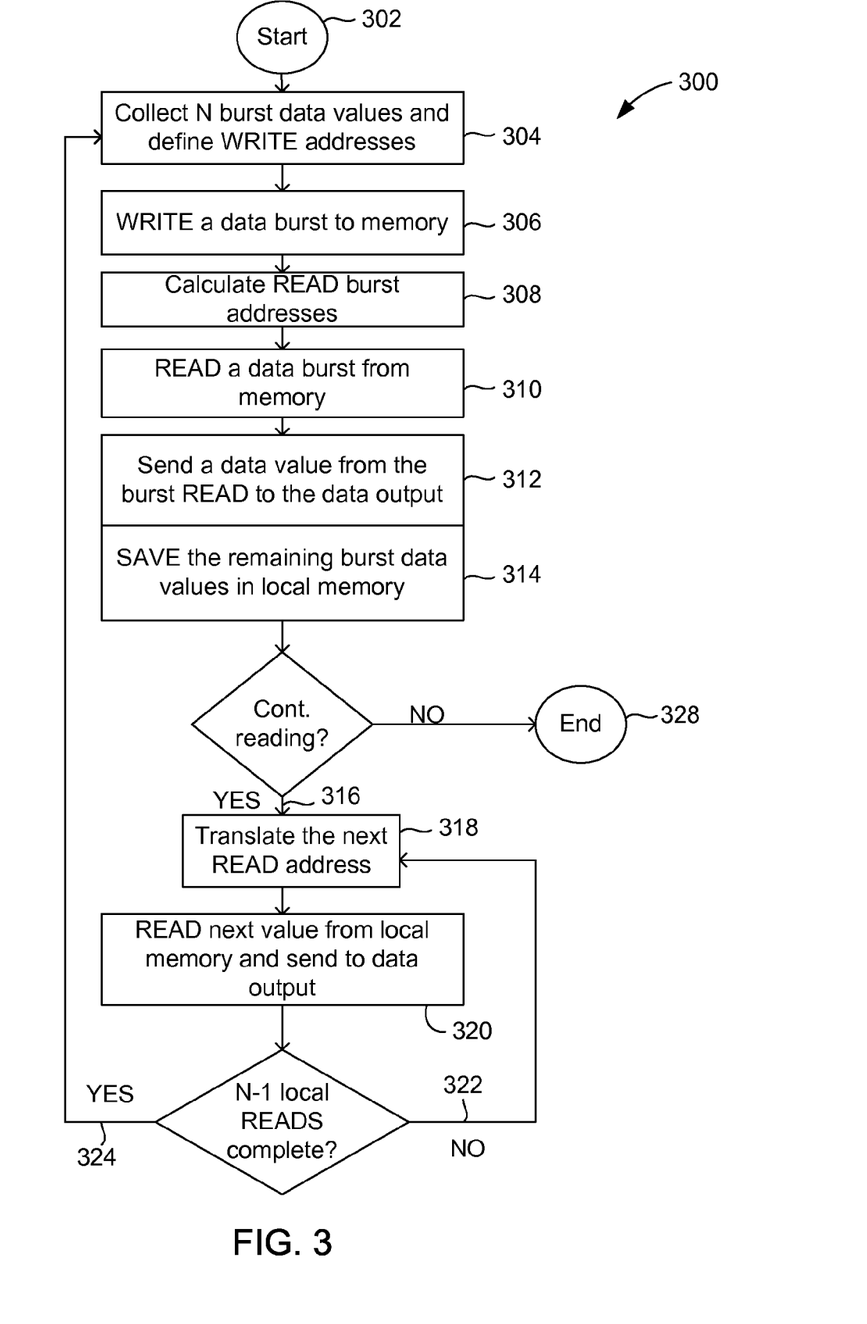
FIG. 3 is a flow chart of a method of operating a data interleaver system according to an embodiment.

FIG. 3 is a flow chart of a method of operating a data interleaver system 300 according to an embodiment. In a particular embodiment, the interleaver system is a convolutional interleaver, which in a more particular embodiment is used in a telecommunication system. The interleaver system has a first IC that includes bulk memory (called external memory for purposes of discussion) suitable for data burst operations and a second IC that includes a local memory (i.e., on-chip memory, which in a particular embodiment is cache memory). Data is written to the memory of the first IC according to an interleaver definition that associates addresses of the external memory in the first IC with the interleaved data. Data is written to the external memory as a burst of data values, and is also read from the external memory in bursts. Generally, the WRITE burst size to the external memory equals the READ burst size from the external memory and the WRITE and READ operations both occur at a fixed rate; however, this is not required for all embodiments since some of the data read may be redundant, invalid, or otherwise discarded (e.g., not written into the local memory). In a yet further embodiment, multiple channels are interleaved while sharing the external memory. While the external memory may be shared between telecommunication or other data channels of the second IC, a re-initialization (memory filling) operation may be needed, which may reduce efficiency in terms of data transfer/time to the downstream data path. Thus, some embodiments include a second external memory array for a second data channel and a second local memory on the second IC. Other embodiments share a memory array of the external memory between multiple channels of the second IC.

Generally, when data is read from the external memory in a burst-READ operation, one datum value is routed to a data output port and the remainder of the data values in the READ burst are stored in local memory for subsequent reading and outputting (i.e., to an on-chip or off-chip receiver for de-interleaving). The memory locations of the data values of the READ burst have been calculated according to a previous burst-WRITE operation determined by the interleaver settings from the second IC or other pre-determined interleaver settings source. Data is read from the external and local memories and assembled (e.g., de-interleaved) in a data path for use within the second IC or to be sent outside the second IC (e.g., to a third IC). In a particular embodiment, the size of the local memory is user-selectable (e.g., to accommodate various interleaver standards), and in a further embodiment local memory is dynamically configurable from one size to another. The WRITE/READ local memory operations typically occur at a fixed rate, but this is not necessary for every embodiment.

An interleaved data transfer process is started (302), such as when a telecommunications channel is opened. Data values are accumulated into a burst of data having a selected burst size, and WRITE addresses are defined for the values in the burst to be written into the external memory (memory) (step 304). Generally, the burst size, local memory size, and external memory organization are defined by the user and, in some embodiments, are configurable or re-configurable.

Figure 4:
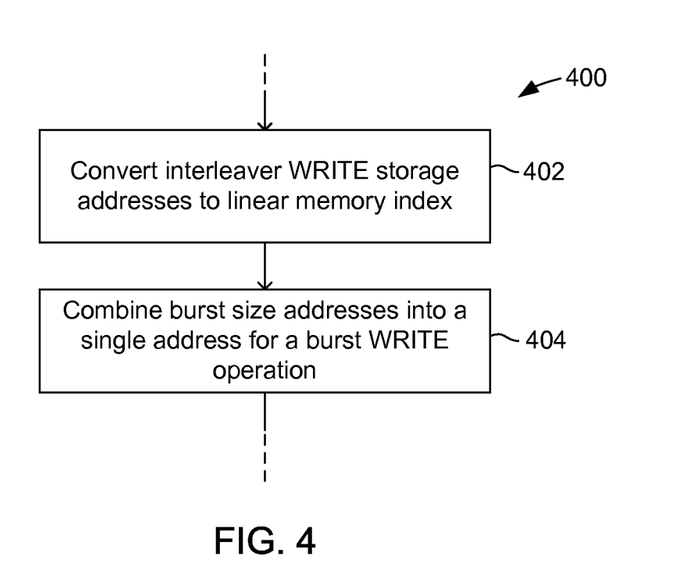
FIG. 4 is a flow chart of a portion of a burst WRITE sub-process according to an embodiment.

FIG. 4 is a flow chart of a process 400 of collecting and defining WRITE addresses for an interleaver technique according to an embodiment (e.g., step 304 of FIG. 3). WRITE storage addresses according to an interleaver definition are mapped to a linear index of the memory (step 402). The linear addresses are combined to a single burst WRITE address (step 404). For example, one burst WRITE address accesses all eight data value memory locations in a burst-of-eight example.

A data burst is written to the memory (step 306) and a burst READ address is defined (step 308).

Figure 5:
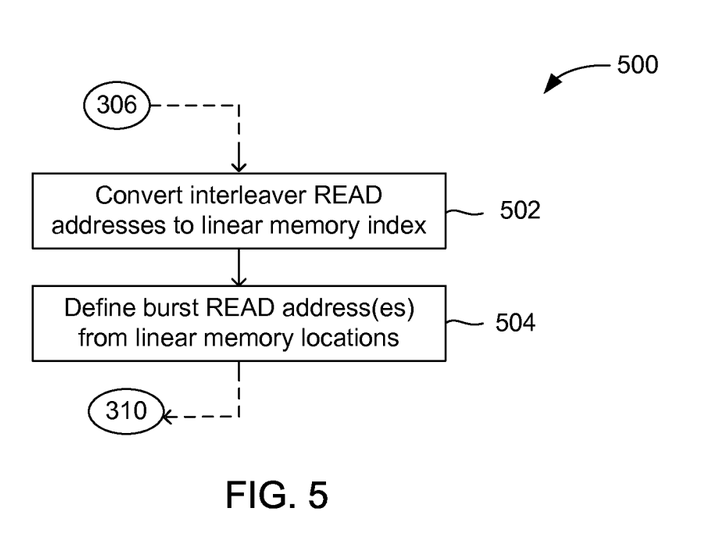
FIG. 5 is a flow chart of a portion of a sub-process for determining READ addresses according to an embodiment.

FIG. 5 is a flow chart of a process 500 of defining a burst READ address (e.g., step 308 of FIG. 3). Then, the interleaver READ addresses are converted (mapped) to the linear memory index of the bulk memory (step 506) and a burst READ address is defined (step 508). The burst READ address is used to read the data burst from bulk memory (e.g., step 310 from FIG. 3) to the second IC.

Continuing with reference to FIG. 3, the data burst is read from the bulk memory (step 310) and a data value from the burst READ operation is sent to the interleaver output (step 312). The remaining values of the data burst are stored in the local memory (step 314). Steps 312 and 314 are shown together because they typically occur essentially simultaneously. The first data value is optionally saved in the local memory, in addition to being sent to the interleaver output.

The interleaver process continues until the communications channel is closed, the system is turned off or is otherwise terminated (step 328); otherwise, more data from the burst is read (branch 316). The next READ address is defined (step 318) and the next datum is read (step 320) from the local memory and output for use in downstream processing (e.g., de-interleaving, not shown). Each next READ address is defined generally according to the interleaver protocol (definition) to translate the desired datum from the previous burst READ to a physical memory location of the local memory, which in some embodiments is substantially similar to the sub-process shown in FIG. 5.

In a particular embodiment, the remaining linear addresses of the data burst are mapped to local memory addresses at a previous point in the process flow (e.g., essentially at step 308). The system continues reading values from local memory (branch 322) until the remaining data (i.e., N−1 data values from a burst size of N, since one value from the burst READ was provided directly to the data output) have been used, and the burst WRITE/READ process continues (branch 324).

As the data values are being read from local memory, the system can accumulate (collect) data input to assemble the next WRITE burst, allowing efficient re-use of local memory resources.

Figure 6:
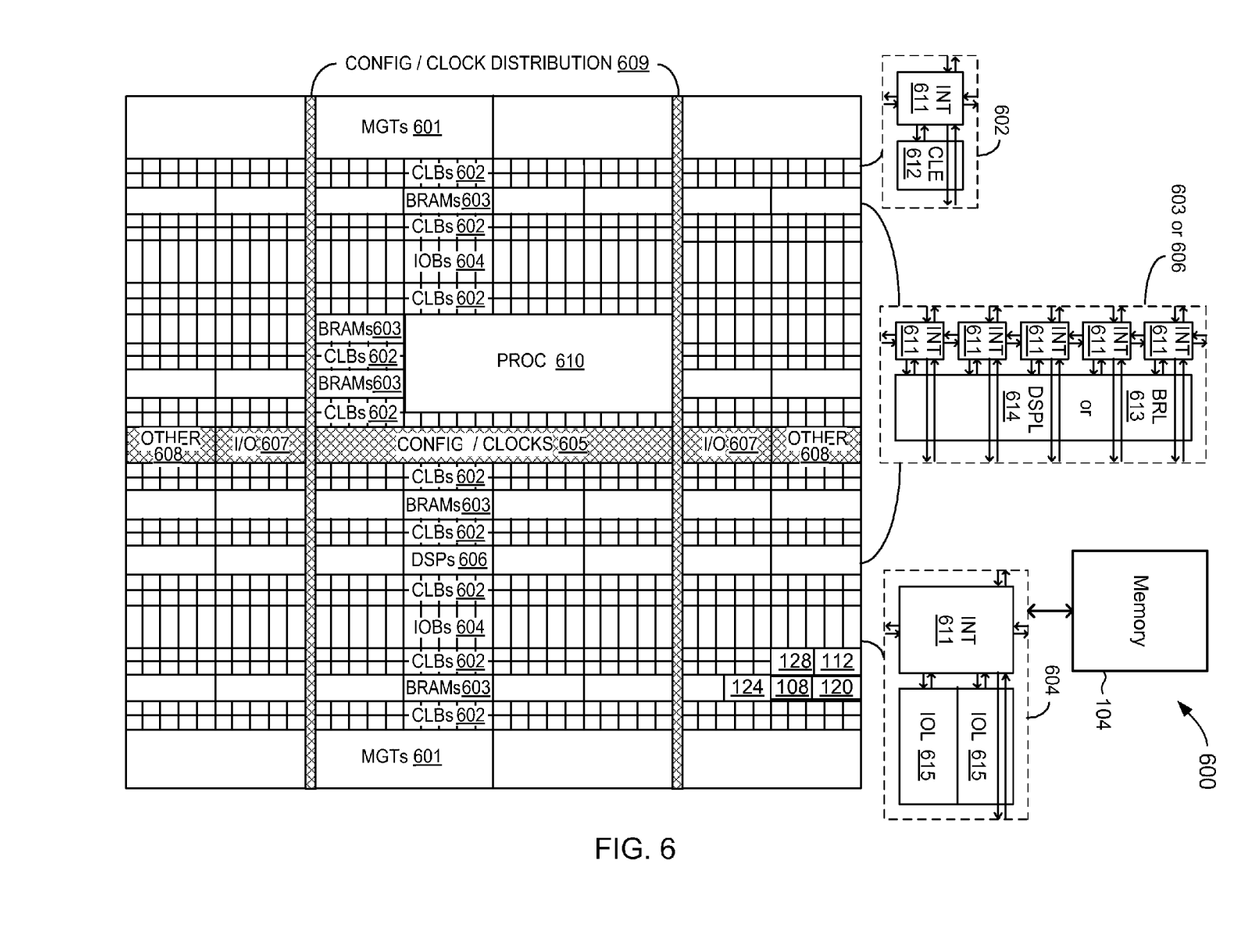
FIG. 6 is a plan view of an FPGA with a portion of a convolutional interleaver system according to an embodiment.

FIG. 6 is a plan view of an FPGA 600 with a portion of a convolutional interleaver system according to an embodiment. The FPGA 600 is configured to include a physical controller 128, write buffer 108, address buffer 120, and address generator 112 that transfer data from a second IC 104, which in a particular embodiment is a second FPGA or a DDRAM IC, to a local memory 124 of the FPGA 400.

The FPGA is fabricated using a CMOS fabrication process or mixed CMOS/NMOS process. The FPGA architecture includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing (DSP) blocks 606, specialized input/output blocks (I/O) 607 (e.g., configuration ports and clock ports), and other programmable logic 608 such as digital clock managers, analog-to-digital converters, system monitoring logic, and so forth. Some FPGAs also include dedicated processor blocks (PROC) 610. Horizontal areas 609 extending from the CONFIG/CLOCKS 605 column are used to distribute the clocks and configuration signals across the breadth of the FPGA 600.

In some FPGAs, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA. The programmable interconnect element (INT) 611 also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT) 611. A BRAM 603 can include a BRAM logic element (BRL) 613 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element (DSPL) 614 in addition to an appropriate number of programmable interconnect elements. An IOB 604 can include, for example, two instances of an input/output logic element (IOL) 615 in addition to one instance of the programmable interconnect element (INT) 611. Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs. PROC 610 may comprise a single power domain or it may comprise multiple power domains or it may share a power domain with other blocks in FPGA 600.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative memory-based interleaver systems using multiple burst-accessible memory chips or alternative interleaver standards could be used. Therefore, the spirit and scope of the appended claims should not be limited to the foregoing description.

The invention claimed is:

1. A system comprising:
a first integrated circuit having a local memory, an address generator receiving interleaver settings and generating WRITE addresses according to first interleaver settings and READ addresses according to second interleaver settings, a physical controller, and a WRITE controller; and
a second integrated circuit having memory supporting burst WRITE operations and burst READ operations, the physical controller of the first integrated circuit writing data from the first integrated circuit to the WRITE addresses for memory locations of the second integrated circuit as a WRITE burst of data according to write address sets in a write address sequence, and reading data from the second integrated circuit to the first integrated circuit as a READ burst of data according to read address sets in a read address sequence, at least one datum from the READ burst of data being stored in the local memory at an address provided by the WRITE controller according to the interleaver settings;
wherein the WRITE addresses comprise duplicate memory locations which are available to be written as a part of each WRITE burst to enable the WRITE burst of data, and a selected memory location of a pair of duplicate memory locations associated with the same memory address of the write address sequence for different time sequences is written with second data associated with a second time sequence during the WRITE burst of data according to the write address sequence, and first data associated with a first time sequence is stored in the other memory location of the pair of duplicate memory locations, wherein the second data associated with the second time sequence is read before the first data associated with the first time sequence according to a read address sequence which is different than the write address sequence.

2. The system of claim 1 wherein the system is a portion of an interleaver system.

3. The system of claim 2 wherein the interleaver system is a convolutional interleaver system.

4. The system of claim 2 wherein the interleaver system comprises multiple channels.

5. The system of claim 1 wherein the memory of the second integrated circuit comprises multi-port memory.

6. The system of claim 1 wherein the memory of the second integrated circuit comprises double data rate random access memory.

7. The system of claim 1 wherein the local memory comprises cache memory.

8. The system of claim 1 wherein N−1 data values are written to the local memory, the READ burst of data having N data values, wherein N is an integer.

9. The system of claim 1 wherein the first integrated circuit is a field-programmable gate array and the local memory is configured in the field-programmable gate array according to an interleaver type.

10. The system of claim 1 wherein the memory of the second integrated circuit has a number of data storage locations used in the system not less than $R*(R-1)*M$ wherein R is a number of rows in a convolutional interleaver system and M is a delay length of a second row in the convolutional interleaver system.

11. A method of operating a data interleaver system comprising:
accumulating N data values from a data input of a first integrated circuit to form a WRITE data burst;
defining first WRITE addresses for the N data values in the WRITE data burst to an external memory of a second integrated circuit according to write address sets in a write address sequence;
defining second WRITE addresses for duplicate memory locations associated with the same memory address of the write address sequence for different time sequences which are available during each WRITE data burst to enable the WRITE data burst;
writing the WRITE data burst according to the write address sequence to the external memory, wherein writing the WRITE burst data comprises writing second data associated with a second time sequence to a selected memory location of a pair of duplicate memory locations, and wherein first data associated with a first time sequence is stored in the other memory location of the pair of duplicate memory locations;
calculating READ addresses from the external memory for a READ data burst;
reading the READ data burst from the external memory according to read address sets in a read address sequence, wherein the read address sequence is different than the write address sequence, and the second data associated with the second time sequence is read before the first data associated with the first time sequence;
sending a first value of the READ data burst to a data output port of the first integrated circuit;
storing remaining values of the READ data burst in local memory of the first integrated circuit; and
reading the remaining values of the READ data burst from the local memory in a sequence according to the data interleaver system and providing the remaining values to the data output port.

12. The method of claim 11 further comprising, after reading the remaining values, accumulating data values from the data input to form a second WRITE data burst; and
writing the second WRITE data burst to the external memory.

13. The method of claim 12 wherein the WRITE data burst and the second WRITE data burst contain partially redundant data.

14. The method of claim 12 wherein the external memory has a first area associated with the first write addresses and a second area associated with the second write addresses.

15. The method of claim 14 wherein a selected number of WRITE bursts equals a burst size of the WRITE burst.

16. The method of claim 14 wherein the first area has a number of rows and a burst size of the WRITE data burst is equal to half the number of rows.

17. The method of claim 11 wherein an average WRITE data rate of the data interleaver system equals an average READ data rate of the data interleaver system.

18. The method of claim 11 wherein the N data values are accumulated from a data channel of a field-programmable gate array.

19. The method of claim 18 wherein data values are further accumulated from a second data channel of the field-programmable gate array.

20. A convolutional interleaver memory system comprising:
a first integrated circuit (IC) having a WRITE buffer receiving data from a data channel of the first IC;

a second integrated circuit having memory operable to be written to and read from in a burst fashion;

an address generator of the first IC assigning memory locations in the memory for data in WRITE bursts according to settings of the convolutional interleaver memory system, wherein WRITE addresses associated with the memory of the second integrated circuit comprise duplicate memory locations associated with the same memory address of the write address sequence for different time sequences which are available during each WRITE burst of data to enable the WRITE burst of data according to write address sets in a write address sequence, and a selected memory location of a pair of duplicate memory locations is written with second data associated with a second time sequence during the WRITE burst of data, and first data associated with a first time sequence is stored in the other memory location of the pair of duplicate memory locations, wherein a read address sequence is different than the write address sequence, and the second data associated with the second time sequence is read before the first data associated with the first time sequence; and a local memory of the first IC storing at least $N-1$ data values of a READ burst from the memory according to read address sets in a read address sequence.

* * * * *